(12) United States Patent
Chiou et al.

(10) Patent No.: US 8,486,823 B2
(45) Date of Patent: Jul. 16, 2013

(54) METHODS OF FORMING THROUGH VIA

(75) Inventors: Wen-Chih Chiou, Miaoli County (TW); Chen-Hua Yu, Hsinchu (TW); Weng-Jin Wu, Hsinchu (TW); Jung-Chih Hu, Taoyuan County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 663 days.

(21) Appl. No.: 12/044,008

(22) Filed: Mar. 7, 2008

(65) Prior Publication Data

US 2009/0224405 A1 Sep. 10, 2009

(51) Int. Cl.
*H01L 21/4763* (2006.01)

(52) U.S. Cl.
USPC ........... 438/622; 438/455; 438/690; 257/758; 257/E23.011; 257/774; 257/686

(58) Field of Classification Search
USPC .......... 257/758, 774, 686, E23.011; 438/622, 438/455, 690
See application file for complete search history.

(56) References Cited

U.S. PATENT DOCUMENTS

| 6,642,081 | B1 | 11/2003 | Patti | |
|---|---|---|---|---|
| 6,897,125 | B2 | 5/2005 | Morrow et al. | |
| 7,622,380 | B1 * | 11/2009 | Sanganeria et al. | 438/624 |
| 2002/0027293 | A1 * | 3/2002 | Hoshino | 257/774 |
| 2003/0193076 | A1 * | 10/2003 | Patti | 257/620 |

OTHER PUBLICATIONS

CN Office Action mailed Apr. 14, 2010.
Three-Dimensional Integrated Circuits and the Future of System-On-Chip Designs proceeding of the IEEE, Robert S. Patti, published on Jun. 30, 2006.

* cited by examiner

*Primary Examiner* — Eva Yan Montalvo
(74) *Attorney, Agent, or Firm* — McClure, Qualey & Rodack, LLP

(57) ABSTRACT

A through via process is performed on a semiconductor substrate with a contact plug formed in an interlayer dielectric (ILD), and then a via plug is formed in the ILD layer to extend through a portion of the semiconductor substrate, followed forming an interconnection structure electrically connected with the contact plug and the via plug.

9 Claims, 6 Drawing Sheets

METHODS OF FORMING THROUGH VIA

TECHNICAL FIELD

The present invention relates to stacked integrated circuits, and particularly to a through via process for wafer-level stacking technology.

BACKGROUND

Three-dimensional (3D) wafer-to-wafer vertical stack technology seeks to achieve the long-awaited goal of vertically stacking many layers of active IC devices such as processors, programmable devices and memory devices inside a single chip to shorten average wire lengths, thereby reducing interconnect RC delay and increasing system performance. One major challenge of 3D interconnects on a single wafer or in a wafer-to-wafer vertical stack is through-via that provides a signal path for high impedance signals to traverse from one side of the wafer to the other. Through silicon via (TSV) is typically fabricated to provide the through-via filled with a conducting material that pass completely through the layer to contact and connect with the other TSVs and conductors of the bonded layers. Examples of methods forming TSVs after the first interconnect metallization process are described in U.S. Pat. No. 6,642,081 to Patti and U.S. Pat. No. 6,897,125 to Morrow, et al. One disadvantage is that the density of the via is typically less because of etch and design limitations, potentially creating connection, contact, and reliability problems. An additional limitation to current TSV systems and methods is the limited availability for thermal dissipation. Therefore, should there be a desire to design TSVs for thermal dissipation, those TSVs will typically occupy the area for normal design, since the contact and metallization layers are already in place. The article entitled: "Three-Dimensional Integrated Circuits and the Future of System-on-Chip Designs", by Robert S. Patti, Proceedings of the IEEE, pp. 1214-1224, Vol. 94, No. 6, June. 2006, (incorporated herein by reference), presents examples of super-contact processes forming tungsten-filled TSVs before the contact process. The super-contact process may impact precision in photolithography and deposition during the subsequent contact process due to stress induced by the huge tungsten-filled TSV.

SUMMARY OF THE INVENTION

Embodiments of the present invention include a through via process performed after a contact process before a first-level interconnection process.

In one aspect, the present invention provides a through via process including the following steps: providing a semiconductor substrate with an integrated circuit (IC) component formed thereon; forming an interlayer dielectric (ILD) layer on the semiconductor substrate and covering the IC component, forming a contact plug in the ILD layer and electrically connected to the IC component; forming at least one via hole extending through the ILD layer and a portion of the semiconductor substrate; depositing a conductive material layer on the ILD layer to fill the via hole; removing the conductive material layer outside the via hole to expose the conductive material layer and the top of the contact plug, wherein the conductive material layer remaining in the via hole forms a via plug; and forming an interconnection structure comprising a plurality of metal layers formed in a plurality of inter-metal dielectric (IMD) layers, wherein a lowermost metal layer of the interconnection structure is electrically connected to the exposed portions of the contact plug and the via plug.

In another aspect, the present invention provides a semiconductor component including a semiconductor substrate with an integrated circuit (IC) component formed thereon, an interlayer dielectric (ILD) layer formed on the semiconductor substrate, a contact plug formed in the ILD layer and electrically connected to the IC component, a via plug formed in the ILD layer and extending through a portion of the semiconductor substrate, and an interconnection structure comprising a plurality of metal layers formed in a plurality of inter-metal dielectric (IMD) layers. The top surfaces of the ILD layer, the via plug and the contact plug are leveled off. A lowermost metal layer of the interconnection structure is electrically connected to the exposed portions of the contact plug and the via plug.

In another aspect, the present invention provides a method including the following steps: providing a first wafer with a first semiconductor substrate, a first integrated circuit (IC) component formed on the first semiconductor substrate and an interlayer dielectric (ILD) layer formed on the semiconductor substrate and covering the IC component; successively forming a contact plug and a via plug in the ILD layer; forming an interconnection structure on the ILD layer; providing a second wafer; and bonding the first wafer to the second wafer to form a wafer stack. The contact plug is electrically connected to the IC component, and the via plug extends through a portion of the first semiconductor substrate. The interconnection structure is electrically connected to the contact plug and the via plug respectively.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
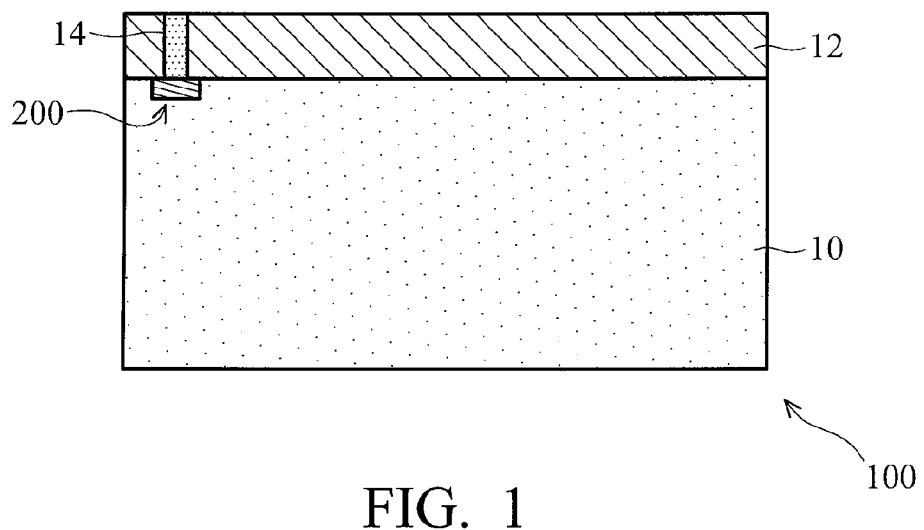
FIGS. 1~10 are cross-sectional diagrams illustrating an exemplary embodiment of a portion of a semiconductor device at stages in an integrated circuit manufacturing process.

Preferred embodiments of the present invention provide a through via process performed after a contact process before a first-level interconnection process. As used throughout this disclosure, the term "through via" refers to a metal-filled via passing through at least a part of a semiconductor substrate. The through via process of the present invention can be called a through-silicon via (TSV) process when the process is directed to form a metal-filled via passing through a part of a silicon-containing semiconductor substrate. The term "first-level interconnection" refers to a lowermost metal layer patterned in a lowermost inter-metal dielectric (IMD) layer overlying contact structures and transistors.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

In an exemplary embodiment, FIGS. 1~10 show cross-sectional views of a portion of a semiconductor device at stages in an integrated circuit manufacturing process. With reference now to FIG. 1, there is shown a cross-sectional diagram of a wafer 100 comprising a semiconductor substrate 10, an IC component 200 processed from the substrate 10, an inter-layer dielectric (ILD) layer 12 overlying the semiconductor substrate 10, and a contact plug 14 formed in the dielectric layer 12 electrically connected with the IC component 200. In detail, the substrate 10 is typically silicon (Si), for example, a silicon substrate with or without an epitaxial layer, or a silicon-on-insulator substrate containing a buried insulator layer. The substrate 10 may also be made of gallium arsenide (GaAs), gallium arsenide-phosphide (GaAsP), indium phosphide (InP), gallium aluminum arsenic (GaAlAs), indium gallium phosphide (InGaP). The IC component 200 may comprise multiple individual circuit elements such as transistors, diodes, resistors, capacitors, inductors, and other active and passive semiconductor devices formed by conventional processes known in the integrated circuit manufacturing art.

The ILD layer 12 is formed on the substrate 10 so as to isolate the IC component 200 from a subsequent formation of an interconnection structure. The ILD layer 12 may be a single layer or a multi-layered structure. The ILD layer 12 may be a silicon oxide containing layer formed of doped or undoped silicon oxide by a thermal CVD process or high-density plasma (HDP) process, e.g., undoped silicate glass (USG), phosphorous doped silicate glass (PSG) or borophosphosilicate glass (BPSG). Alternatively, the ILD layer 12 may be formed of doped or P-doped spin-on-glass (SOG), PTEOS, or BPTEOS. Following a dry etching process carried out, a contact hole is formed in the ILD layer 12, and a conductive material layer is deposited to fill the contact hole, forming a contact plug 14. The contact plug 14 may be formed of tungsten, tungsten-based alloy, copper, or copper-based alloy.

Figure 2:
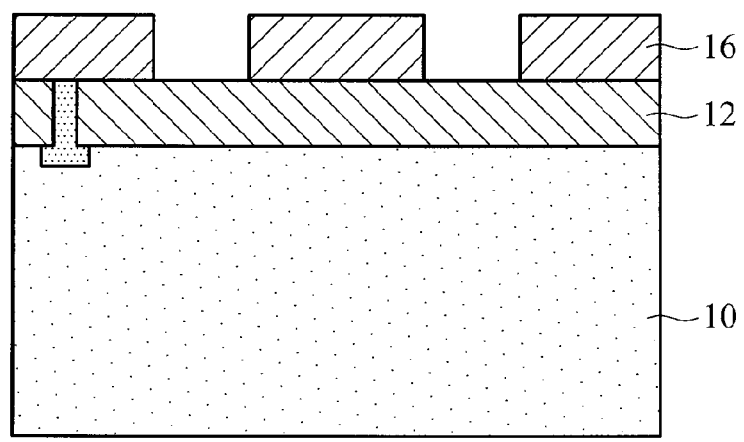
Figure 3:
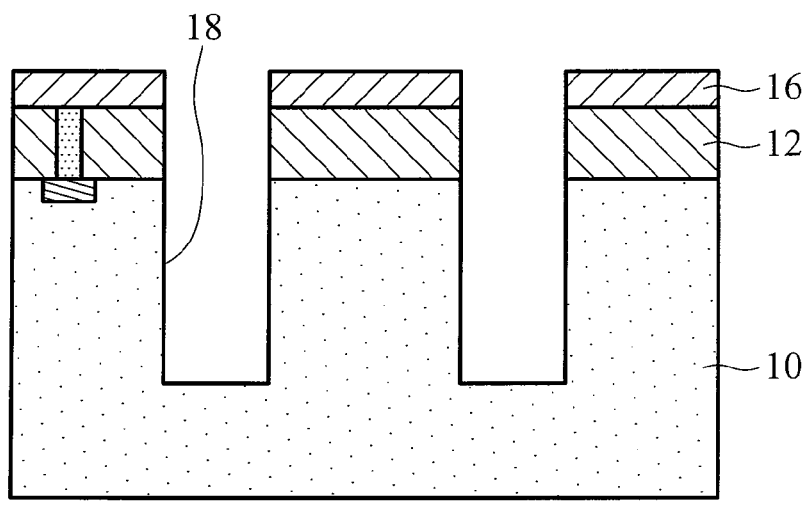
Figure 4:
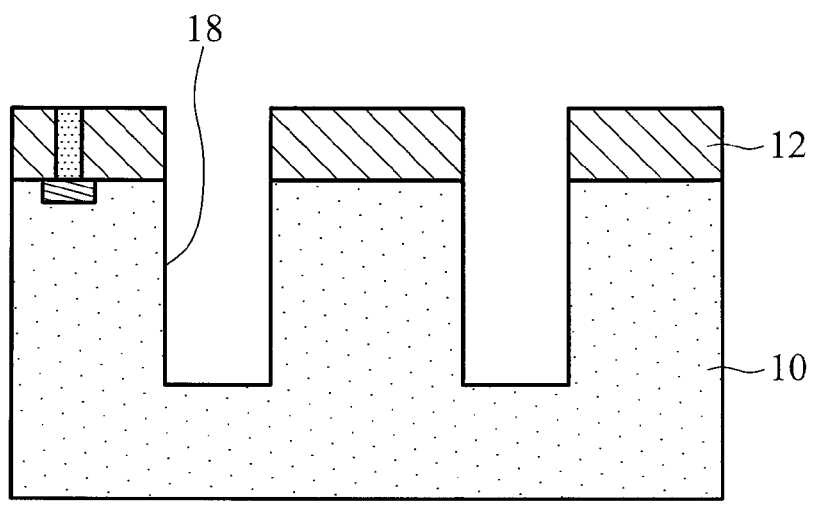

Referring to FIGS. 2~4, following planarization, e.g., chemical mechanical planarization (CMP) on the ILD layer 12, a lithographically patterned photoresist layer 16 is provided. A dry etching process is then carried out to form at least one via hole 18 that passes through the ILD layer 12 and extends to reach a predetermined depth of the substrate 10. Then the patterned photoresist layer 16 is stripped.

Figure 5:
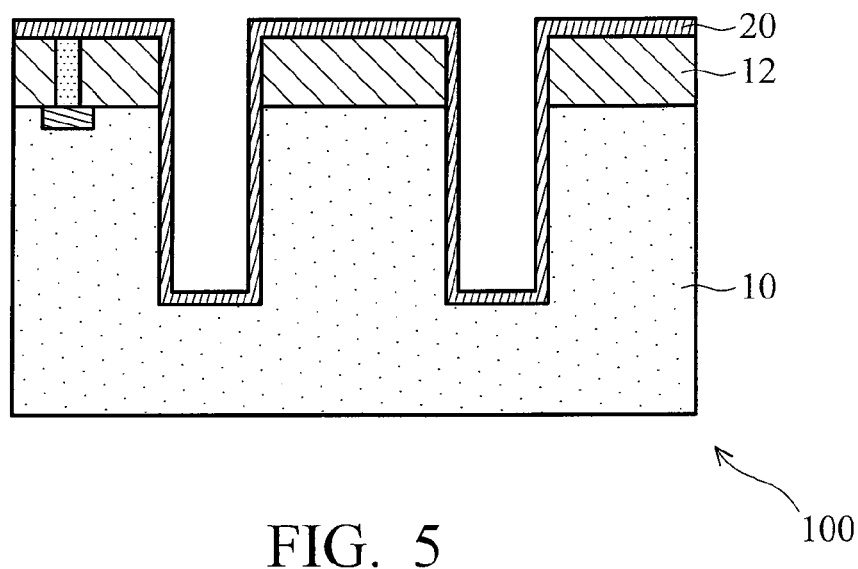
Figure 6:
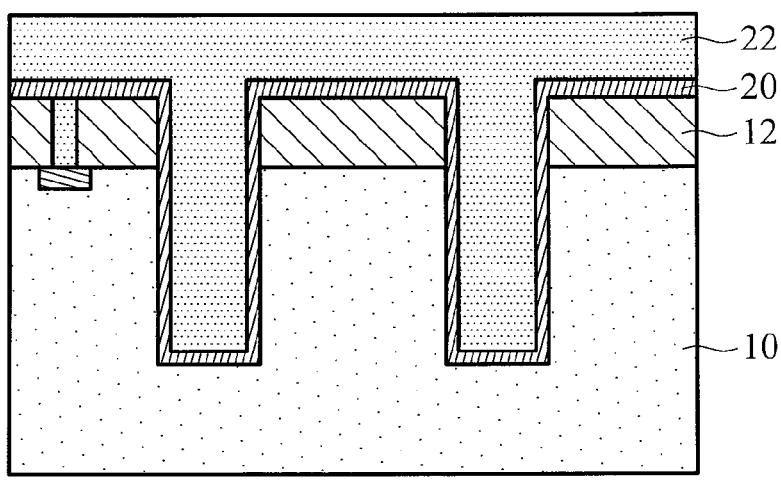

Referring to FIG. 5, a passivation layer 20 is conformally deposited on the wafer 100 to line the sidewalls and bottom of the via holes 18 in order to prevent any conducting material from leaching into any active portions of the circuitry of the wafer 100. The passivation layer 20 may be formed of silicon oxide, silicon nitride, combinations thereof, or the like. A conductive material layer 22 is then deposited on the passivation layer 20 of the wafer 100, as shown in FIG. 6, to fill the via holes 18. The conductive material layer 22 may include a diffusion barrier layer and a metal layer. For example, a diffusion barrier layer is conformally deposited along the bottom and sidewalls of the via hole 18 followed by a metal-fill process, thus providing both an excellent diffusion barrier in combination with good conductivity. The diffusion barrier layer may include, but is not limited to, a refractory material, TiN, TaN, Ta, Ti, TiSN, TaSN, W, WN, Cr, Nb, Co, Ni, Pt, Ru, Pd, Au, CoP, CoWP, NiP, NiWP, mixtures thereof, or other materials that can inhibit diffusion of copper into the ILD layer 12 by means of PVD, CVD, ALD or electroplating. The metal layer may include a low resistivity conductor material selected from the group of conductor materials including, but is not limited to, copper and copper-based alloy. For example, a copper-fill process includes metal seed layer deposition and copper electrochemical plating. Alternatively, the metal layer may comprise various materials, such as tungsten, aluminum, gold, silver, and the like.

Figure 7:
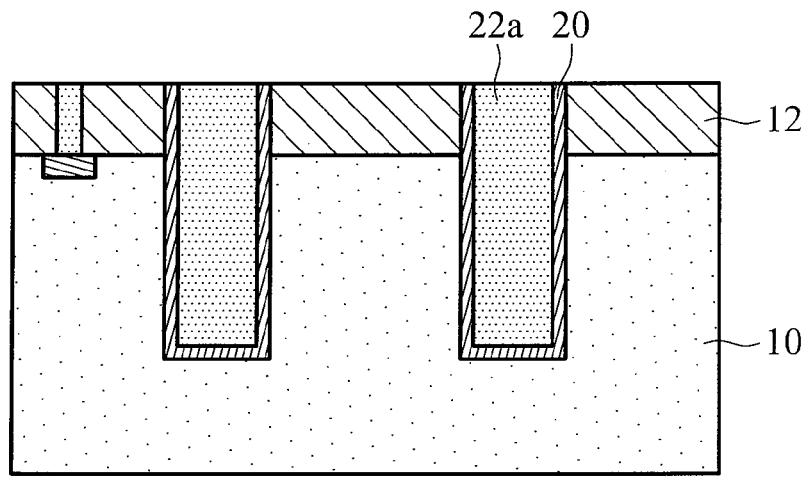

Referring to FIG. 7, after removing the excess portions of the conductive material layer 22 and the passivation layer 20 outside the via holes 18, either through etching, chemical mechanical polishing (CMP), or the like, the wafer 100 now comprises via plugs 22a passing through the ILD layer 12 and extending through a portion of the substrate 10.

Figure 8:
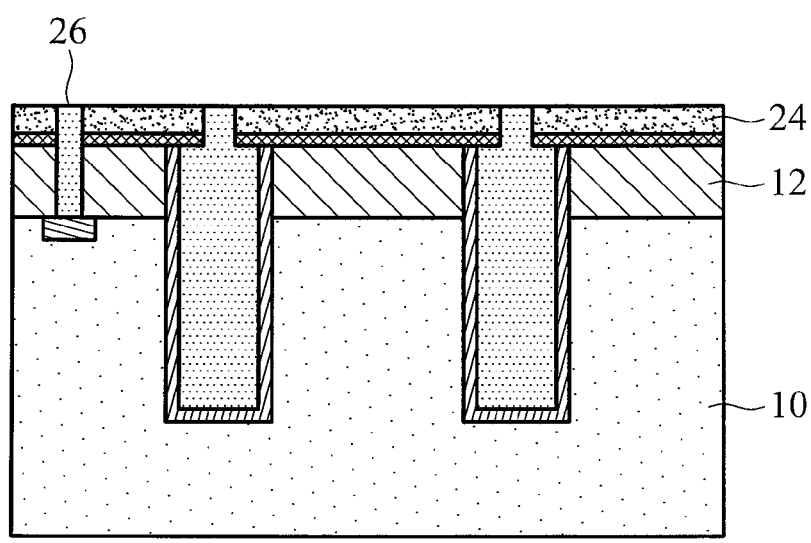

Next, back-end-of-line (BEOL) interconnection technologies are processed on the wafer 100 to fabricate an interconnection structure including a plurality of interconnection layers and inter-metal dielectric (IMD) layers. As illustrated in FIG. 8, a first-level interconnection layer 26 is formed in an IMD layer 24 to electrically connect with the contact plug 14 and the via plugs 22a respectively. Thereafter, another level interconnection layers and IMD layers are fabricated on the first-level interconnection layer 26, which are omitted in the drawings for clarity and convenience. Embodiments of the present invention use copper-based conductive materials for forming the interconnection layers. The copper-based conductive material is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. A standard damascene process may be used with the copper BEOL interconnection. Although the embodiments of the present invention illustrate copper interconnection patterns, the present invention also provides value when using metallic materials excluding copper for BEOL interconnection.

Figure 9:
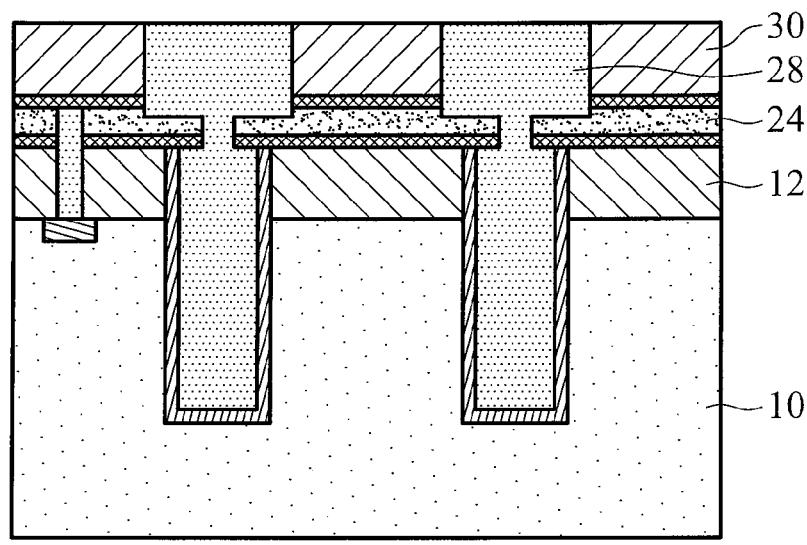

Referring to FIG. 9, bonding contacts 28 are formed in an insulating layer 30 overlying a completed top-level interconnect layer and a top-level IMD layer. The insulating layer 30 may be removed or etched to reveal the bonding contacts 28 slightly elevated above the top of insulating layer 30. The bonding contacts 28 may be formed of copper-based conductive materials. The insulating layer 30 can insulate the IC component 200 from any other circuitry or devices in any wafers bonded to the wafer 100.

Figure 10:
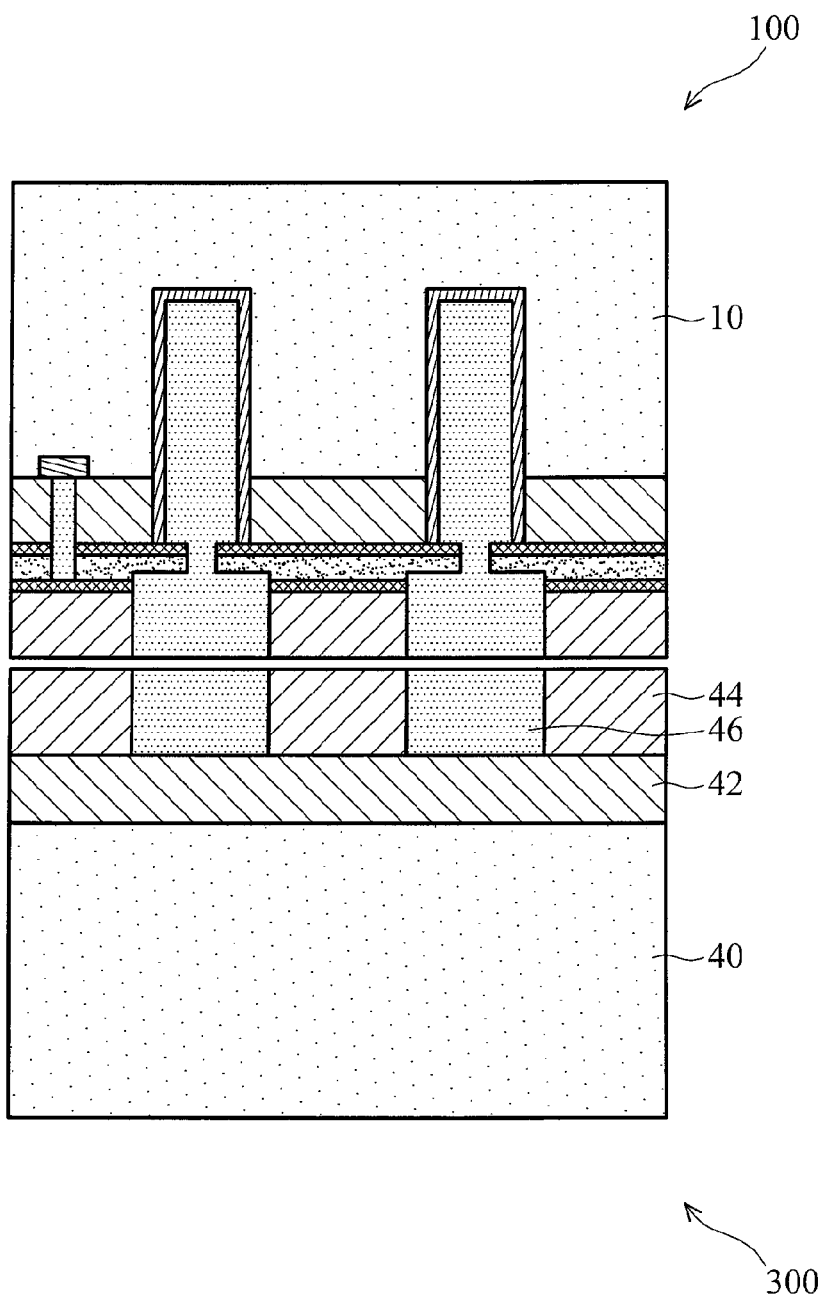

FIG. 10 illustrates the cross-section of the wafer 100 stacked and bonded to another wafer 300. The wafer 300 comprises a substrate 40, an insulating layer 42, an IMD layer 44 and bonding pads 46. The wafers 100 and 300 are bonded together at the bonding contacts 28 and the bonding pads 46 to form a three-dimensional stacked wafer. It should be noted that any number of different devices, components, connectors, and the like, might be integrated into the wafers 100 and 300. The specific devices or lack of devices that may be illustrated herein are not intended to limit the embodiments of the present invention in any way.

Compared with existing methods for forming TSV in semiconductor devices, the through via process according to the embodiment of the present invention eliminates the impact on precision of photolithography, etching and deposition during the contact process, and results in advantages of lower through-via Rc, higher through-via density, a minimum need for keep-out zone, routing freedom for interconnection metal layers and better yields.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A through via process, comprising:
   providing a semiconductor substrate, comprising: an integrated circuit (IC) component formed on said semiconductor substrate; an interlayer dielectric (ILD) layer formed on said semiconductor substrate and covering said IC component, and a contact plug formed in said ILD layer and electrically connected to said IC component;
   forming at least one via hole subsequent to the contact plug formation, said via hole extending through said ILD layer and a portion of said semiconductor substrate;
   depositing a passivation layer lining the bottom and sidewalls of said via hole;
   after depositing said passivation layer, depositing a conductive material layer on said ILD layer to fill said via hole;
   removing said conductive material layer outside the via hole to expose said conductive material layer and the top of said contact plug, wherein said conductive material layer remaining in said via hole forms a via plug;
   removing a portion of the passivation layer after the conductive material layer is deposited; and
   after removing the portion of the passivation layer, forming an interconnection structure comprising a plurality of metal layers formed in a plurality of inter-metal dielectric (IMD) layers, wherein a lowermost metal layer of said interconnection structure is electrically connected to the exposed portions of said contact plug and said via plug.

2. The through via process of claim 1, wherein said conductive material layer comprises copper or copper-based alloy.

3. The through via process of claim 1, wherein said contact plug is formed of tungsten or tungsten-based alloy.

4. The through via process of claim 1, where said passivation layer comprises silicon oxide, silicon nitride, or combinations thereof.

5. A method, comprising:
   providing a first wafer, comprising: a first semiconductor substrate; a first integrated circuit (IC) component formed on said first semiconductor substrate; and an interlayer dielectric (ILD) layer formed on said semiconductor substrate and covering said IC component;
   successively forming a contact plug and a via plug subsequent to said formation of said contact plug in said ILD layer, wherein said contact plug is electrically connected to said IC component, and said via plug extends through a portion of said first semiconductor substrate, wherein forming the via plug comprises:
   depositing a passivation layer lining the bottom and sidewalls of a via hole corresponding to said via plug;
   after depositing said passivation layer, depositing a conductive material layer on said ILD layer to fill said via hole;
   removing said conductive material layer outside the via hole to expose said conductive material layer and the top of said contact plug, wherein said conductive material layer remaining in said via hole forms said via plug;
   removing a portion of the passivation layer after the conductive material layer is deposited;
   after removing the portion of the passivation layer, forming an interconnection structure on said ILD layer, wherein said interconnection structure is electrically connected to said contact plug and said via plug respectively;
   providing a second wafer; and
   bonding said first wafer to said second wafer to form a wafer stack.

6. The method of claim 5, wherein said via plug comprises copper or copper-based alloy.

7. The method of claim 5, wherein said contact plug is formed of tungsten or tungsten-based alloy.

8. The method of claim 5, where said passivation layer comprises silicon oxide, silicon nitride, or combinations thereof.

9. A through via process, comprising:
   providing a semiconductor substrate, comprising: an integrated circuit (IC) component formed on said semiconductor substrate; an interlayer dielectric (ILD) layer formed on said semiconductor substrate and covering said IC component, and a contact plug formed in said ILD layer and electrically connected to said IC component;
   forming at least one via hole extending through said ILD layer and a portion of said semiconductor substrate;
   depositing a passivation layer lining the bottom and sidewalls of said via hole;
   after depositing said passivation layer, depositing a conductive material layer on said ILD layer to fill said via hole;
   forming a via plug by removing said conductive material layer outside the via hole to expose said conductive material layer and the top of said contact plug;
   removing a portion of the passivation layer after the conductive material layer is deposited; and
   after removing the portion of the passivation layer, forming an interconnection structure comprising a plurality of metal layers formed in a plurality of inter-metal dielectric (IMD) layers, wherein a lowermost metal layer of said interconnection structure is electrically connected to the exposed portions of said contact plug and said via plug.

* * * * *